United States Patent [19]

Bayer et al.

[11] Patent Number: 4,522,862

[45] Date of Patent: Jun. 11, 1985

[54] HIGH RESOLUTION RECORDING MEDIUM AND METHOD FOR PRODUCING SAME

[75] Inventors: Erich Bayer, Trosberg; Anton Beckerbauer, Nussdorf; Georg Flatscher, Schneizlreuth; Martin Ullrich, Ruhpolding, all of Fed. Rep. of Germany

[73] Assignee: Johannes Heidenhain GmbH, Traunreut, Fed. Rep. of Germany

[21] Appl. No.: 445,557

[22] Filed: Nov. 30, 1982

[30] Foreign Application Priority Data

Dec. 4, 1981 [DE] Fed. Rep. of Germany ....... 3147985

[51] Int. Cl.³ .......................... B32B 3/00; G03C 5/00
[52] U.S. Cl. ................................... 428/195; 428/209; 428/913; 430/7; 430/293; 430/321; 350/164; 350/166
[58] Field of Search .............. 430/321, 7, 8, 293; 428/195, 913, 209; 350/1.6, 1.7, 166, 164

[56] References Cited

U.S. PATENT DOCUMENTS

| | | | |
|---|---|---|---|
| 3,727,233 | 4/1973 | Kanaya et al. | 346/1 |
| 4,151,321 | 4/1979 | Hiesinger | 428/195 |
| 4,258,126 | 3/1981 | Hiesinger | 430/324 |
| 4,317,876 | 3/1982 | Haering | 430/293 |
| 4,359,519 | 11/1982 | Kraus et al. | 430/321 |
| 4,431,695 | 2/1984 | Flatscher | 428/209 |

Primary Examiner—John E. Kittle
Assistant Examiner—José G. Dees
Attorney, Agent, or Firm—Willian Brinks Olds Hofer Gilson & Lione Ltd.

[57] ABSTRACT

A recording medium with a multicolor high resolution pattern created by layer packs. Pattern-forming layers of the layer packs are successively applied by photolithographic means in a sequence corresponding to a color of the high resolution pattern. The pattern-forming layers of the layer packs are separate from one another on the substrate of the recording medium.

The process for producing the recording medium includes applying a photoresist layer to a substrate and developing the photoresist. Pattern-forming layers are successively applied over the whole surface of the substrate in a sequence corresponding to a color. The remaining photoresist and the layers overlying it are removed to leave a sequence of pattern-forming layers on the substrate separate from any adjacent pattern-forming layers.

18 Claims, 15 Drawing Figures

HIGH RESOLUTION RECORDING MEDIUM AND METHOD FOR PRODUCING SAME

BACKGROUND OF THE INVENTION

This invention relates to recording mediums displaying a high resolution multicolor pattern. These recording mediums are especially used in the formation of microtopographical maps.

The recording of multicolor images is described in U.S. Pat. No. 3,727,233. The recording medium disclosed in this patent is made by applying a metal layer of high reflectivity to a glass substrate and covering this metal layer with an organic polymer layer. The desired pattern is formed on the polymer layer by exposing it to electron beams. The irradiation intensity of the electron beams determines the pattern formed by the polymerization of the layer. Over the polymer layer, another metal layer of high reflectivity is applied. The interference patterns yield a multicolor image when viewed under natural light. One disadvantage of this method is that the metal layers are of equal thickness over the entire substrate, thereby permitting no variations in the saturation of the individual colors of the image. The patterned interference layer formed by the organic polymer is very heat sensitive. Because of this and the high elimination strength associated with this, strong reenlargement (Ruckvergrosserung) of the multicolor image is not permitted. The deficient lightfastness and shrinkage of the organic polymer interference layer over time can cause the colors to change.

The German unexamined patent specification No. OS 26 58 623 discloses a recording medium which records with high information density. This recording medium is particularly used for multicolor micro-images. At least two interference filters (Interferenzfilter) for two different colors are applied onto the substrate of this recording medium. Each of the interference filters is made with an unpatterned inorganic absorption-free interference layer which extends with equal thickness over the entire substrate. This inorganic interference layer is bounded on each side by at least one inorganic reflecting layer which forms the pattern of the recording. In another embodiment disclosed in this patent specification, the unpatterned interference layer is bounded on each surface by at least one patterned, high-refracting absorption-free layer. Between every two high-refracting layers there is present an unpatterned, low-refracting absorption-free layer. The presence of the unpatterned interference layers which extend with equal thickness over the entire substrate in the different embodiments of this patent specification, incurs the requirement that for each desired color a series of patterning steps is necessary. During this process the exposure mask must be adjusted for each patterning step, requiring the greatest of precision. The adjustment of the exposure mask is also very time consuming.

SUMMARY OF THE INVENTION

The present invention is directed to a recording medium for high resolution multicolor patterns made with patterned or pattern-forming layer packs. The pattern-forming layers of the layer packs are separate from one another on the substrate. The pattern-forming layers of a layer pack are applied successively to the substrate in a sequence corresponding to a color in the multicolor pattern. The layer packs include an interference filter and/or an edge filter (Kantenfilter). In recording mediums with interference filters, at least part of the interference layer is a pattern-forming layer in a layer pack.

It is an object of the present invention to reduce the number of process steps necessary in creating the recording. Several pattern-forming layers are successively applied over the whole surface of the substrate after a layer of photoresist has been developed. The pattern is formed for all of these layers at one time when the remaining photoresist is removed with all of the layers overlying it. A further object of the present invention is avoiding the problems of adjusting the exposure mask for multiple patterning steps, thereby improving the optical quality of the recorded pattern.

Advantageously, the present invention allows for production of a recording medium with great savings in time and cost. The method used to produce the recording medium is more accurate so that the rejection rate is considerably lower than in formerly used methods. In addition, the present invention achieves a better color hue purity and color hue saturation.

The invention itself, together with further objects and attendant advantages, will best be understood by reference to the following detailed description taken in conjunction with the accompanying drawings.

DETAILED DESCRIPTION OF THE PREFERRED EMBODIMENTS

Figure 1A:
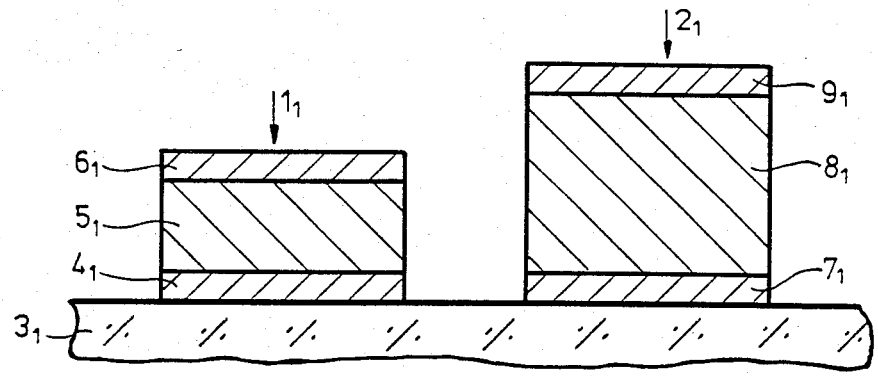
FIGS. 1a–c are schematic diagrams of recording mediums of the present invention having metal dielectric interference filters.
Figure 1B:
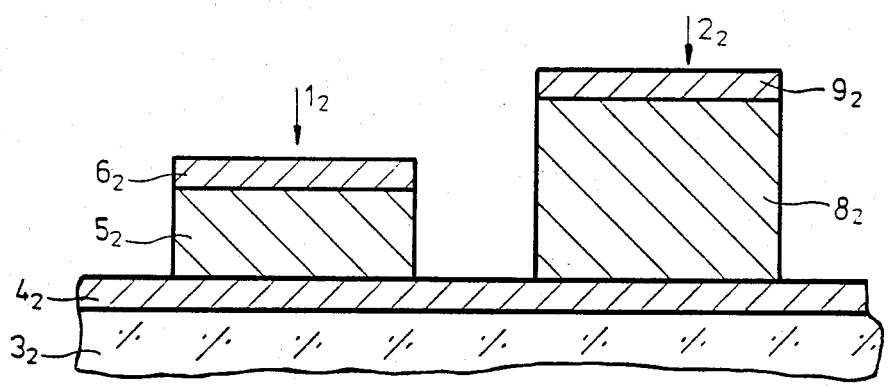
Figure 1C:
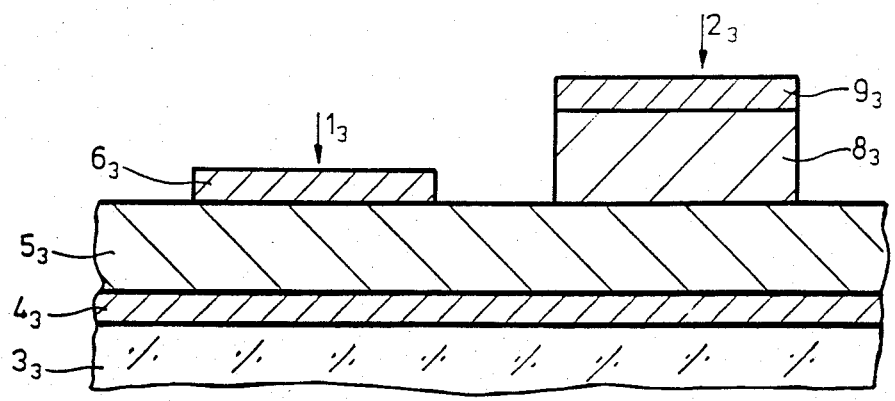

Referring now to FIGS. 1a–c, there are shown recording mediums of the present invention using dielectric interference filters in the form of pattern-forming layer packs $1_1$, $1_2$ and $1_3$ to create a first color and pattern forming layers packs $2_1$, $2_2$ and $2_3$ to form a second color. The layer packs $1_1,2_1$ are generated to form the recording medium of FIG. 1a as follows. A first photoresist layer (not shown) is applied to the whole surface of a substrate $3_1$. This layer is exposed by means of a first exposure mask. After the first photoresist layer has been developed, an inorganic reflecting layer $4_1$ is applied over the whole surface of the substrate $3_1$. This is followed by the application of an inorganic absorption free interference layer $5_1$ to the whole substrate surface. The optical thickness of the interference layer $5_1$ defines the first color. The interference layer $5_1$ is covered by an inorganic layer $6_1$ over the whole surface of the substrate. The remaining first photoresist layer is removed together with the layers $4_1$-$6_1$ overlying the remaining photoresist layer. This leaves only the layer pack $1_1$ on the substrate $3_1$.

To generate a second color on the substrate $3_1$, a second photoresist layer is applied over the whole surface. This is then exposed by means of a second exposure mask. After the second photoresist layer has been developed, an inorganic layer $7_1$, an inorganic absorption-free interference layer $8_1$ and an inorganic layer $9_1$ are applied over the whole surface of the substrate $3_1$. The interference layer $8_1$ defines the second color hue. The remaining second photoresist layer together with the layers $7_1$-$9_1$ overlying it is removed. This leaves a second layer pack $2_1$ locally separate and independent from the layer pack $1_1$ on the substrate $3_1$.

Another embodiment for recording mediums having dielectric interference filters of the present invention is shown in FIG. 1b. Here the first step in the process of generating the recording is to apply an inorganic reflecting layer $4_2$ over the whole surface of the substrate $3_2$. The inorganic reflecting layers are generally made of metal and are hereinafter referred to as metal layers. Then, to generate a first color hue, a first photoresist layer is applied over the surface. The first photoresist layer is exposed by means of a first exposure mask and the layer is developed. Then, over the whole surface of the substrate $3_2$ an inorganic absorption-free interference layer $5_2$ defining the first color hue is applied. Over this a metal layer $6_2$ is placed. The remaining first photoresist layer together with the layers $5_2, 6_2$ present on top of it is removed. This leaves the layer pack $1_2$ on the substrate $3_2$. A second photoresist layer is applied over the whole surface of the substrate. This layer is exposed by means of a second exposure mask to form the pattern for the second color. After the second photoresist layer has been developed, an inorganic absorption-free interference layer $8_2$ is applied over the whole surface of the substrate $3_2$. A metal layer $9_2$ is applied over the interference layer $8_2$. The remainder of the second photoresist layer together with the layers $8_2, 9_2$ on top of it is removed to leave the layer $8_2, 9_2$ separate from the layers $5_2, 6_2$ on the substrate $3_2$.

For still another embodiment of this recording medium reference is now made to FIG. 1c. A metal layer $4_3$ is applied over the entire surface of the layer carrier $3_3$. Over the metal layer $4_3$, an inorganic absorption-free interference layer $5_3$ for the generation of the first color is applied. This layer is subsequently covered by a first photoresist layer. The same steps as before are followed. The first photoresist layer is exposed and developed. The first layer pack $1_3$ is completed by applying a metal layer $6_3$ over the substrate $3_3$, followed by the removal of the first photoresist layer with the metal layer $6_3$ positioned over it. This leaves the layer pack $1_3$ on the substrate $3_3$. To generate the second color, a second photoresist layer is applied over the whole surface of the substrate $3_3$ and this is exposed by means of a second exposure mask. After the second photoresist layer has been developed, an inorganic absorption-free interference layer $8_3$ is applied over the whole surface of the substrate to complete the interference layer for the second layer pack. A metal layer $9_3$ is then applied over the whole surface. Once again, the remainder of the second photoresist layer, together with the layers $8_3, 9_3$ present on top of it, are removed. This leaves the layers $8_3, 9_3$ and the layer $6_3$ separated on the substrate $3_3$.

In this embodiment just described for FIG. 1c, the interference layers $5_3$ and $8_3$ combine to define the second color. The metal layer $6_3$ for layer pack $1_3$ and the interference layer $8_3$ and metal layer $9_3$ for layer pack $2_3$ are the pattern-forming layers in this embodiment. In FIG. 1b, the pattern-forming layers are the layers $5_2, 6_2$ in the layer pack $1_2$ and the layers $8_2, 9_2$ in the layer pack $2_2$. In FIG. 1a, the pattern-forming layers are the layers $4_1, 5_1, 6_1$ in layer pack $1_1$ and the layers $7_1, 8_1, 9_1$ in the layer pack $2_1$. The sequence of the pattern-forming layers in each of the layer packs 1, 2 correspond to the color displayed by the respective layer pack. The metal layers 4,6,7,9 are partially permeable layers.

Figure 2A:
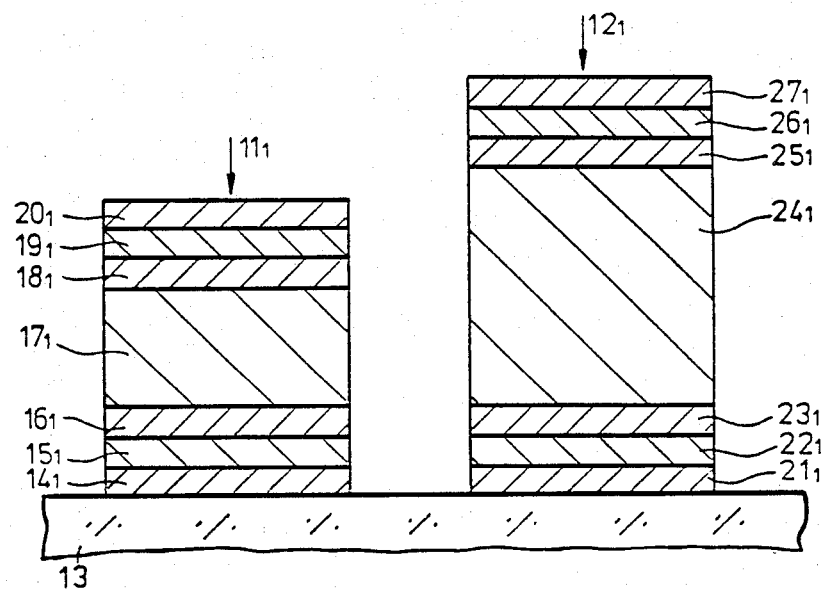
FIGS. 2a and b are schematic diagrams of recording mediums of the present invention having purely dielectric interference filters (reindielektrischen Interferenzfiltern)

The present invention may also be made of recording mediums having purely dielectric interference filters. Referring now to FIGS. 2a and b, layer packs $11_1, 11_2$ form the pattern for a first color and pattern-forming layer packs $12_1, 12_2$ produce a second color.

The first step in generating the recording medium of FIG. 2a is to apply over the entire surface of the substrate $13_1$, a first photoresist layer. The photoresist layer is exposed using a first exposure mask. After the photoresist layer has been developed, the following layers are successively applied to the entire surface of the substrate $13_1$ in the following sequence corresponding to the first color: a high-refracting absorption-free layer $14_1$, a low-refracting absorption-free layer $15_1$, a high-refracting absorption-free layer $16_1$, an inorganic absorption-free interference layer $17_1$ to define the first color, a high-refracting absorption-free layer $18_1$, a low-refracting absorption-free layer $19_1$ and a high-refracting absorption-free layer 20. The remaining first photoresist layer, together with the layers $14_1$-$20_1$ present over it, is then removed. This leaves the layer pack $11_1$ on the substrate $13_1$. The second color is generated in the same manner. A second photoresist layer is applied over the whole surface of the substrate $13_1$. This is exposed by means of a second exposure mask. After this second photoresist layer has been developed, the pattern-forming layers for the second layer pack $12_1$ are applied over the whole surface of the substrate. The layers as applied in succession include a high-refracting absorption-free layer $21_1$, a low-refracting absorption-free layer $22_1$, a high-refracting absorption-free layer $23_1$, an inorganic absorption-free interference layer $24_1$ defining the second color, a high-refracting absorption-free layer $25_1$, a low-refracting absorption-free layer $26_1$ and a high-refracting absorption-free layer $27_1$. As usual, the remainder of the second photoresist layer, together with the layers $21_1$-$27_1$ lying over it, is then removed. This leaves the layer packs $12_1$ and $11_1$ independent from one another on the substrate $13_1$.

Figure 2B:
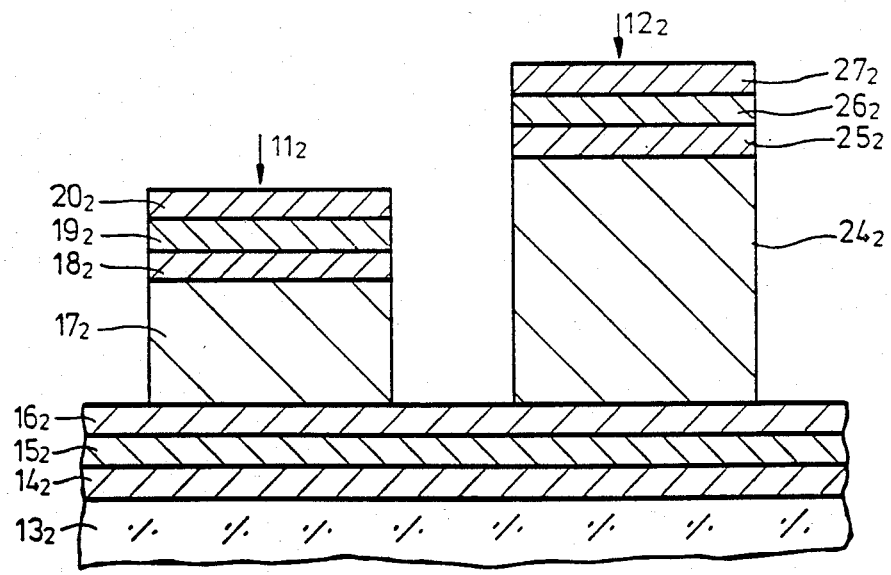

Another embodiment of the present invention using the purely dielectric interference filters is shown in FIG. 2b. Over the entire surface of the substrate $13_2$ are applied the whole-surface layers including a high-refracting absorption-free layer $14_2$, a low-refracting absorption-free layer $15_2$ and a high-refracting absorption-free layer $16_2$. The substrate $13_2$ is then covered with the first photoresist layer for the generation of the first color. The photoresist layer is exposed and developed using a first exposure mask. This is followed by applying an inorganic absorption-free interference layer $17_2$ over the whole surface of the substrate $13_2$ to define the first color. The remaining layers are successively applied over the surface of the substrate $13_2$ in a sequence corresponding to the first color. In order, these layers include a high-refracting absorption-free layer $18_2$, a low-refracting absorption-free layer $19_2$ and a high-refracting absorption-free layer $20_2$. The remaining first photoresist layer is removed together with the layers $17_2$-$20_2$ overlying it. The layer pack $11_2$ is left remaining on the substrate $13_2$. To generate the second layer pack $12_2$, a second photoresist layer is applied over the whole surface of the substrate $13_2$. This layer is exposed by means of a second exposure mask. After it has been developed the pattern-forming layers of the layer pack $12_2$ are applied in succession, including an interference layer $24_2$ defining the second color, a high-refracting absorption-free layer $25_2$, a low-refracting absorption-free layer $26_2$ and a high-refracting absorption free layer $27_2$. The remainder of the second photoresist layer together with the layers $24_2$-$27_2$ lying over it is then removed.

In FIG. 2a, the pattern-forming layers of the layer pack $11_1$ are the layers $14_1$-$20_1$ and for the layer pack $12_1$ are the layers $21_1$-$27_1$. In FIG. 2b, the pattern-forming layers are layers $17_2$-$20_2$ in the layer pack $11_2$ and layers $24_2$-$27_2$ in the layer pack $12_2$. The pattern-forming layers of each layer pack are separate from each other on the substrate.

Figure 3A:
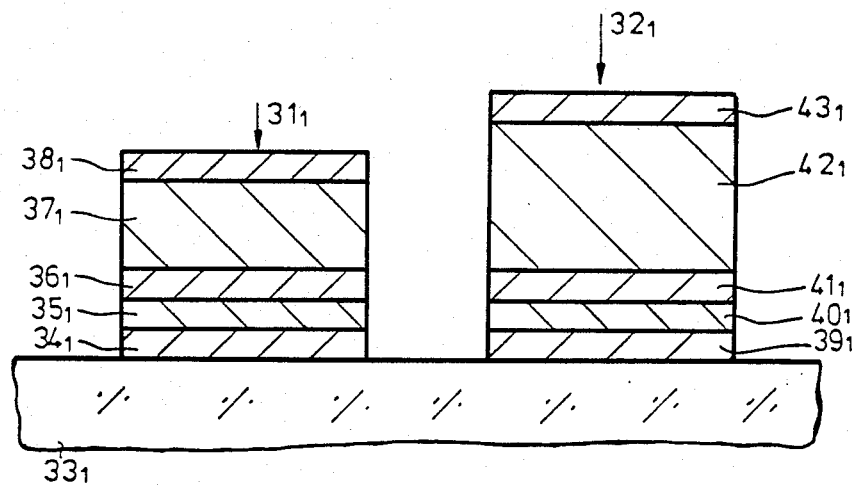
FIGS. 3a and b are schematic diagrams of recording mediums of the present invention having semi-filters (Halbfiltern)

The present invention may also be made with semifilters as shown in FIGS. 3a and b. Pattern-forming layer pack $31_1$ on the substrate $33_1$ in FIG. 3a is made of a high-refracting absorption-free layer $34_1$, a low-refracting absorption-free layer $35_1$, a high-refracting absorption-free layer $36_1$, an inorganic interference layer $37_1$ defining the first color and a metal layer $38_1$. The layers $34_1$-$38_1$ are the pattern-forming layers of the layer pack $31_1$. Pattern-forming layer pack $32_1$ on the substrate $33_1$ is made of a high-refracting absorption-free layer $39_1$, a low-refracting absorption-free layer $40_1$, a high-refracting absorption-free layer $41_1$, an inorganic absorption-free interference layer $42_1$ defining the second color and a metal layer $43_1$. The layers $39_1$-$43_1$ are the pattern-forming layers of the layer pack $32_1$.

Figure 3B:
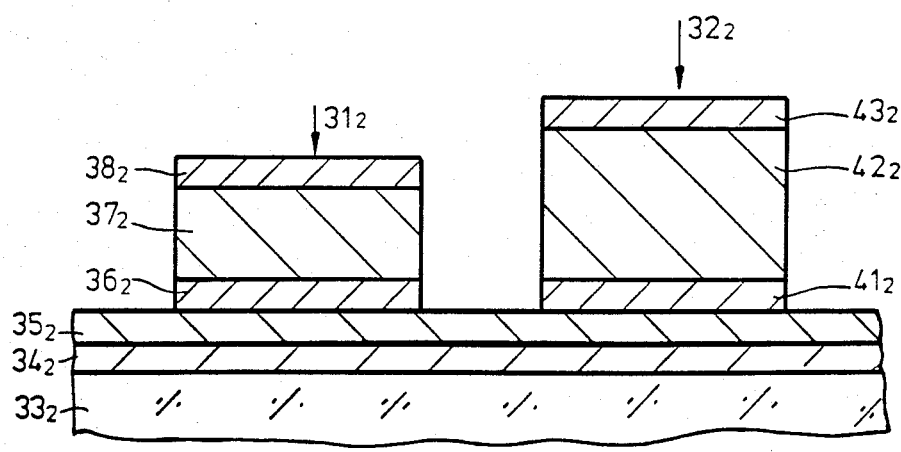

Referring now to FIG. 3b, the layer pack $31_2$ on the substrate $33_2$ consists of a high-refracting absorption-free layer $34_2$ covering the whole surface, a low-refracting absorption-free layer $35_2$ also covering the whole surface, a high-refracting absorption-free layer $36_2$, an inorganic absorption-free interference layer $37_2$ defining the first color and a metal layer $38_2$. The pattern-forming layers of the layer pack $31_2$ are the layers $36_2$-$38_2$. The layers $34_2$ and $35_2$ cover the whole surface and do not contribute to the pattern formation. The layer pack $32_2$ on the substrate $33_2$ consists of the whole surface layers $34_2$ and $35_2$, a high-refracting absorption-free layer $41_2$, an inorganic absorption-free layer $42_2$ defining the second color and a metal layer $43_2$. The pattern-forming layers of the layer pack $32_2$ are the layers $41_2$-$43_2$. The recording mediums of FIGS. 3a and b are generated by photolithographic means as described for the preceding embodiments. The metal layers 38 and 43 are partially permeable layers.

Figure 4A:
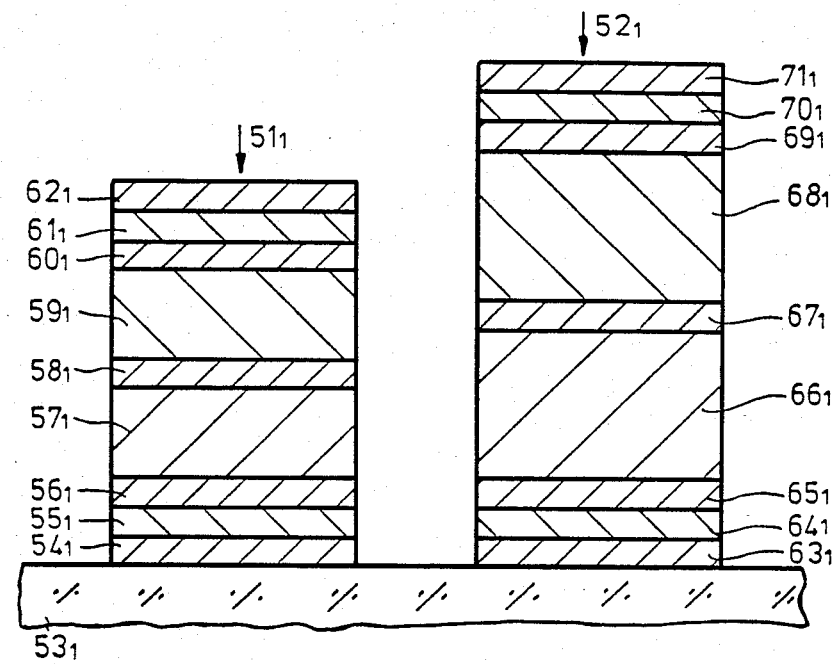
FIGS. 4a–d are schematic diagrams of recording mediums of the present invention having induced transmission filters (induzierten Transmissionsfiltern)

Referring now to FIGS. 4a–d, recording mediums of the present invention are shown using induced transmission filters. In FIG. 4a, the pattern-forming layer pack $51_1$ on the substrate $53_1$ consists of the following layers in succession: a high-refracting absorption-free layer $54_1$, a low-refracting absorption-free layer $55_1$, a high-refracting absorption-free layer $56_1$, a first inorganic absorption-free interference layer $57_1$ in accordance with the first color, a metal layer $58_1$, a second inorganic absorption-free interference layer in accordance with the first color, a high-refracting absorption-free layer $60_1$, a low-refracting absorption-free layer $61_1$ and a high-refracting absorption-free layer $62_1$. This sequence of layers corresponds to the first color. The layers $54_1$-$62_1$ are the pattern-forming layers of the layer pack $51_1$. Pattern-forming layer pack $52_1$ on the substrate $53_1$ consists of a similar arrangement of layers in succession: a high-refracting absorption-free layer $63_1$, a low-refracting absorption-free layer $64_1$, a high-refracting absorption-free layer $65_1$, a first inorganic absorption-free interference layer $66_1$ in accordance with the second color, a metal layer $67_1$, a second inorganic absorption-free interference layer $68_1$ in accordance with the second color, a high-refracting absorption-free layer $69_1$, a low-refracting absorption-free layer $70_1$ and a high-refracting absorption-free layer $71_1$. The layers $63_1$-$71_1$ are the pattern-forming layers of the layer pack $52_1$.

Figure 4B:
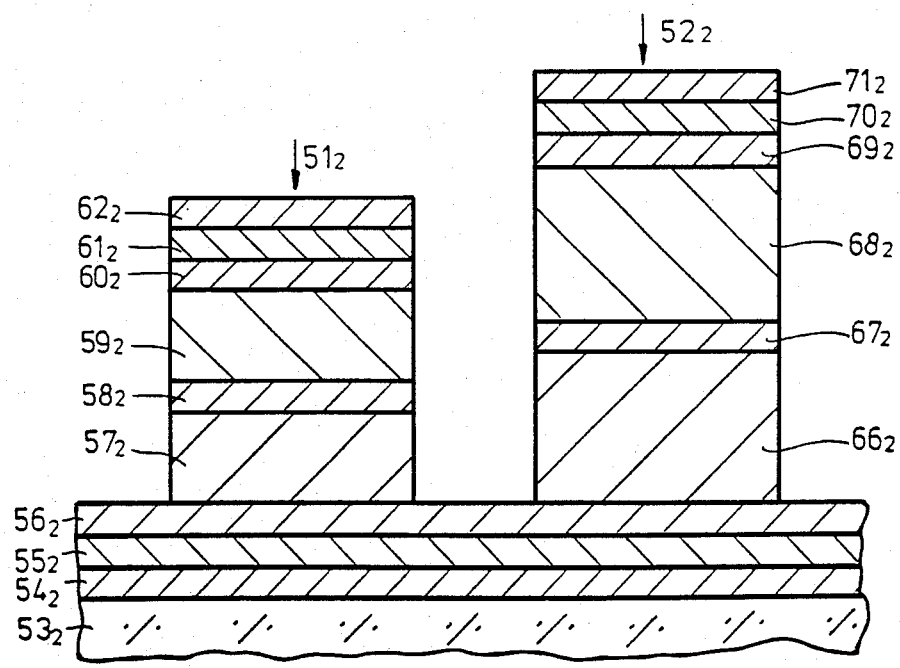

Referring now to FIG. 4b, the layer pack $51_2$ on the substrate $53_2$ consists of a whole-surface high-refracting absorption-free layer $54_2$, a whole-surface low-refracting absorption-free layer $55_2$, a whole surface high-refracting absorption-free layer $56_2$, a first inorganic absorption-free interference layer $57_2$ corresponding to the first color, a metal layer $58_2$, a second inorganic absorption-free interference layer $59_2$ corresponding to the first color, a high-refracting absorption-free layer $60_2$, a low-refracting absorption-free layer $61_2$ and a high-refracting absorption-free layer $62_2$. The layers $57_2$-$62_2$ are the pattern-forming layers of the layer pack $51_2$, while the whole surface layers $54_2$-$56_2$ do not contribute at all to the pattern formation. The layer pack $52_2$ on the substrate $53_2$ consists of a similar arrangement of layers in succession including, the whole surface layers $54_2$-$56_2$, a first inorganic absorption-free interference layer $66_2$ corresponding to the second color, a metal layer $67_2$, a second inorganic absorption-free interference layer $68_2$ corresponding to the second color, a high-refracting absorption-free layer $69_2$, a low-refracting absorption-free layer $70_2$ and a high-refracting absorption-free layer $71_2$. The layers $66_2$-$71_2$ are the pattern-forming layers of the layer pack $52_2$ while the whole-surface layers $54_2$-$56_2$ are non-pattern-forming layers which do not contribute to the pattern formation. The recording mediums according to the FIGS. 4a and b are generated by photolithographic means as described for the previous embodiments.

Figure 4C:
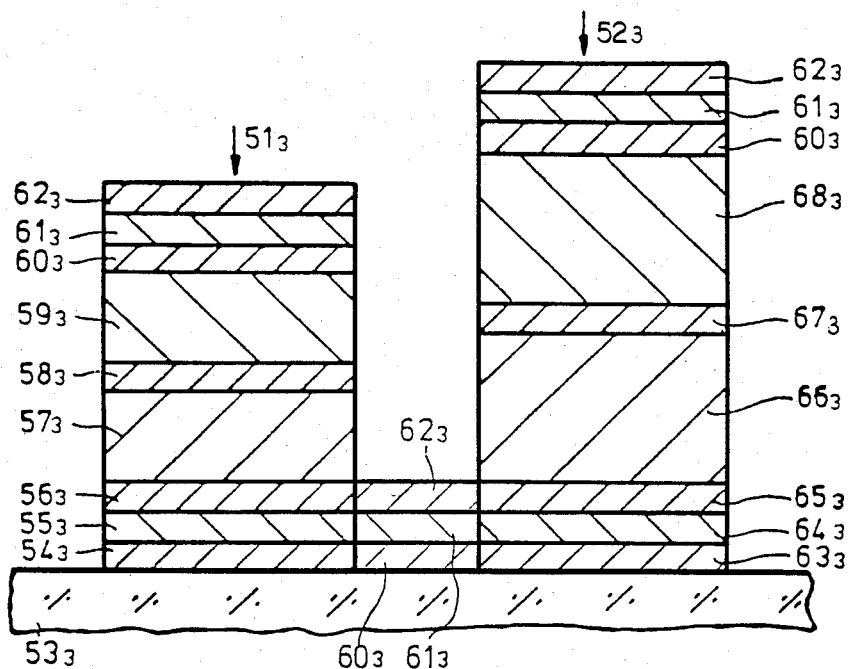

Referring now to FIG. 4c, the process for generating the recording medium there shown shall be described. A first photoresist layer is applied over the whole surface of the substrate $53_3$. This layer is exposed by means of a first exposure mask. After the photoresist layer has been developed, the following layers are applied over the whole surface of the substrate $53_3$ in succession in a sequence which corresponds to the desired first color, a high-refracting absorption-free layer $54_3$, a low-refracting absorption-free layer $55_3$, a high-refracting absorption-free layer $56_3$, a first inorganic absorption-free interference layer $57_3$ corresponding to the first color, a metal layer $58_3$ and a second inorganic absorption-free interference layer corresponding to the first color. The remaining first photoresist layer, together with the layers $54_3$-$59_3$ which are situated over the remaining photoresist, are removed. To generate the second color on the substrate $53_3$, a second photoresist layer is applied over the whole surface. This is exposed by means of a second exposure mask. After the second photoresist layer has been developed, the whole surface of the substrate $53_3$ is covered by the following layers in succession, a high-refracting absorption-free layer $63_3$, a low-refracting absorption-free layer $64_3$, a high-refracting absorption-free layer $65_3$, a first inorganic absorption-free interference layer $66_3$ in accordance with the second color, a metal layer $67_3$ and a second inorganic absorption-free interference layer $68_3$ in accordance with the second color. The remaining second photoresist layer, together with the layers $63_3$-$68_3$ lying over it, is then removed. Left remaining on the substrate $53_3$ are the pattern-forming layers $54_3$-$59_3$ of the first layer pack $51_3$ and the pattern-forming layers $63_3$-$68_3$ of the layer pack $52_3$ for the second color. The layer packs and the substrate are now covered with a high-refracting absorption-free layer $60_3$, a low-refracting absorption-free layer $61_3$, and high-refracting absorption-free layer $62_3$. These whole-surface layers $60_3$-$62_3$ are non-pattern-forming layers which do not contribute to the pattern formation.

Figure 4D:
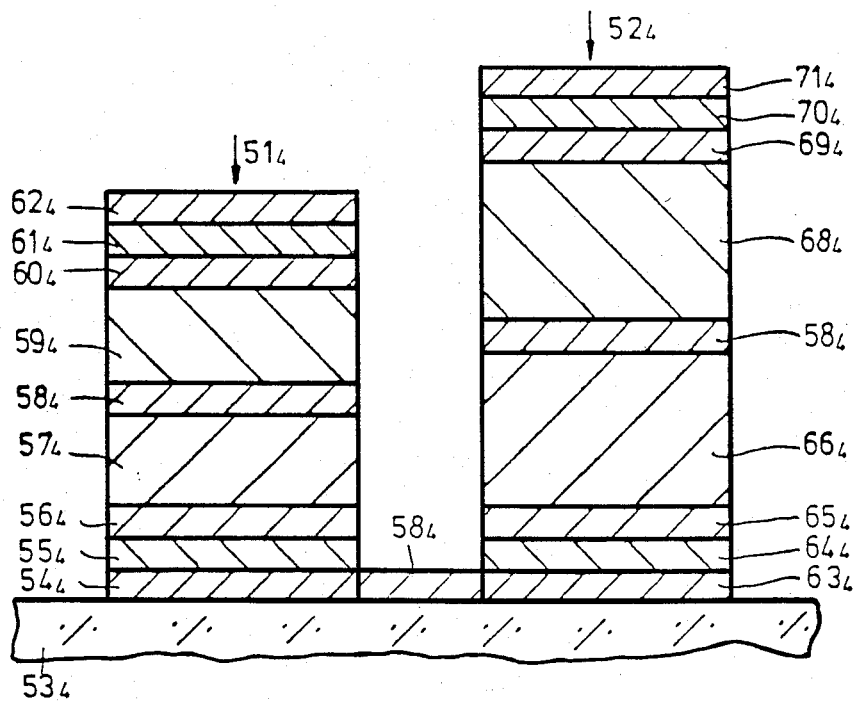

Another method for carrying out the present invention results in the recording medium shown in FIG. 4d. A first photoresist layer is applied over the whole surface of the substrate $53_4$ and is exposed by means of a first exposure mask. After the layer has been developed, the following layers are successively applied over the whole surface of the substrate $53_4$ in a sequence corresponding to the first color: a high-refracting absorption-free layer $55_4$, a low-refracting absorption-free layer $55_4$, a high-refracting absorption-free layer $56_4$ and a first inorganic absorption-free interference layer $57_4$ corresponding to the first color. The remaining first photoresist layer, together with the layers $54_4$-$57_4$ lying over it, are then removed. To generate the second color, a second photoresist layer is applied over the whole surface of the substrate $53_4$. The second photoresist layer is exposed by means of a second exposure mask. After it has been developed, the whole surface of the substrate $53_4$ is covered by a high-refracting absorption-free layer $63_4$, a low-refracting absorption-free layer $64_4$, a high-refracting absorption-free layer $65_4$ and a first inorganic absorption-free layer $65_4$ according to the second color. The remaining second photoresist layer, together with the layers $63_4$-$66_4$ situated on top of it, is then removed. At this point, remaining on the substrate $53_4$ are the first part of the layer pack $51_4$ for the first color and the first part of the layer pack $52_4$ for the second color. A metal layer $58_4$ is applied over the entire surface of the substrate $53_4$ and does not contribute to the pattern formation. A third photoresist layer is applied over this layer and is exposed by means of the first exposure mask. After developing the third photoresist layer, the whole surface of the substrate $53_4$ is covered by the successive application of the following layers in sequence for producing the first color: a second inorganic absorption-free interference layer $59_4$ corresponding to the first color, a high-refracting absorption-free layer $60_4$, a low-refracting absorption-free layer $61_4$ and a high-refracting absorption-free layer $62_4$. The remaining third photoresist layer, together with the layers $59_4$-$62_4$ lying over it, is then removed. For generating the second color, a fourth photoresist layer is applied over the entire surface of the substrate $53_4$ and this is exposed by means of a second exposure mask. After the fourth photoresist layer has been developed, the following layers are applied in succession over the whole surface of the substrate $53_4$: a second inorganic absorption-free interference layer $68_4$, corresponding to the second color, a high-refracting absorption-free layer $69_4$, a low-refracting absorption-free layer $70_4$ and a high-refracting absorption-free layer $71_4$. The remaining fourth photoresist layer, together with the layers $68_4$-$71_4$ lying over it, is then removed. The metal layers 58,67 found in FIG. 4a-d are partially permeable layers.

Figure 5A:
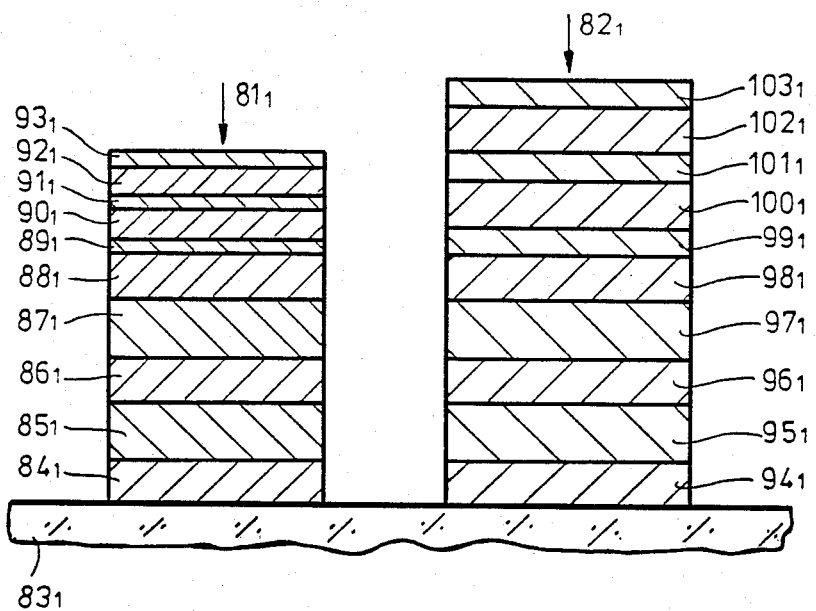
FIGS. 5a and b are schematic diagrams of recording mediums of the present invention having edge filters (reflectors)

It is also possible to use edge filters in the recording mediums of the present invention as shown in FIGS. 5a and b. A pattern-forming layer pack $81_1$ on the substrate $83_1$ of FIG. 5a consists of two edge filters $84_1$-$88_1$ and $89_1$-$93_1$ lying one over the other. In each edge filter the low-refracting absorption-free layers $85_1,87_1$, and $90_1,92_2$ are bounded on both sides by the high-refracting absorption-free layers $84_1, 86_1, 88_1$, and $89_1,91_1,93_1$. The layer pack $82_1$ on the substrate $83_1$ also consists of two edge filters $94_1$-$98_1$ and $99_1$-$103_1$ lying one over the other. Each edge filter consists of high-refracting absorption-free layers $94_1, 96_1, 98_1, 99_1, 101_1, 103_1$ between which there are present low-refracting absorption-free layers $95_1,97_1,100_1,102_1$. The layers $84_1$-$93_1$ are the pattern-forming layers of the layer pack $81_1$ and the layers $94_1$-$103_1$ are the pattern-forming layers of the layer pack $82_1$.

Figure 5B:
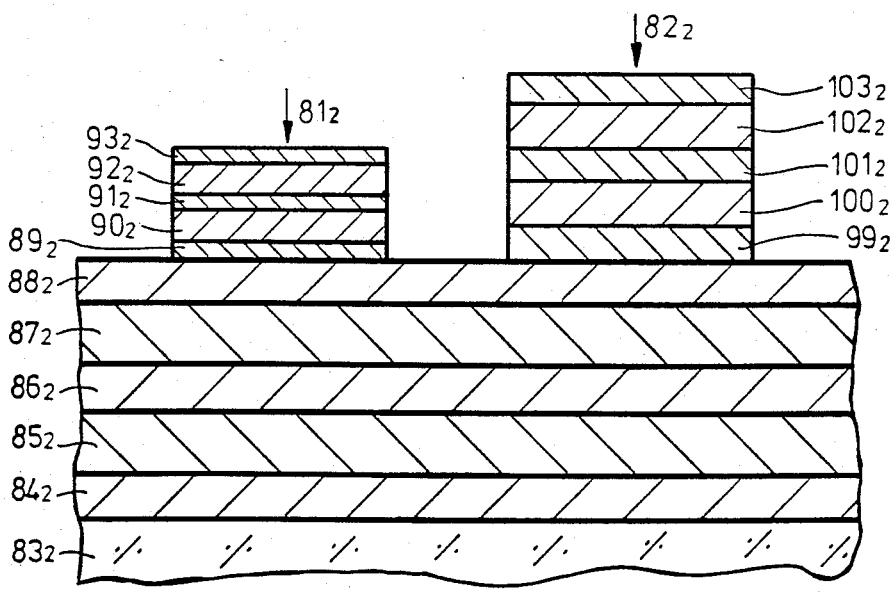

Referring now to FIG. 5b, the layer pack $81_2$ on the substrate $83_2$ consists of two edge filters $84_2$-$88_2$ and $89_2$-$93_2$ lying one on the other. The edge filter $84_2$-$88_2$ consists of whole surface absorption-free layers $84_2,86_2,88_2$, between which there are present whole surface low-refracting absorption-free layers $85_2,87_2$. The edge filter $89_2$-$93_2$ consists of the high-refracting absorption-free layers $89_2,91_2,93_2$, between which there are present low-refracting absorption-free layers $90_2, 92_2$. The layers of the edge filter $90_2$-$93_2$ are the pattern-forming layers of the layer pack $81_2$. The layer pack $82_2$ on the substrate $83_2$ consists of the whole-surface edge filter $84_2$-$88_2$ over which is present the edge filter $99_2$-$103_2$. This edge filter $99_2$-$103_2$ consists of high-refracting absorption-free layers $99_2, 101_2, 103_2$ between which are present the low-refracting absorption-free layers $100_2, 102_2$. The layers of the edge filter $99_2$-$103_2$ are the pattern-forming layers of the layer pack $82_2$. The whole surface edge filter $84_2$-$88_2$ does not contribute to the pattern formation of the layer packs $81_2,82_2$.

In the filters 1,2,11,12,31,32,51,52 the first and second color hues are determined by the optical thicknesses of the interference layers 5,8,17,24,37,42, 57,59,66,68. The saturation of these color hues is determined by the reflection capacity of the metal layers 4,6,7,9,38,43,58,67 and respectively of the high-refracting layers 14,16,18,20,21,23,25,27,34,36,39,41, 54,56,60,62,63,65,69,71 and of the low-refracting layers 15,19,22,26,35,40,55,61,64,70. Thus, the layers and their sequence in a layer pack will determine the optical qualities of the resulting color.

In an edge filter (reflector), the spectrum of high transmission declines over a steep slope to a spectrum range of low transmission. The optical thicknesses of the high-refracting and low-refracting layers of an edge filter amount to a quarter wavelength ($\lambda/4$), where the wavelength ($\lambda$) is equal to the greatest wavelength of the least transmission by the edge filter. In FIG. 5a, the edge filters of the first part of the layer packs $84_1$-$88_1,94_1$-$98_1$ display in the range of the two color hues to be generated, a transmission which increases as the wavelength increases. The other edge filters in the second part of the layer packs $89_1$-$93_1,99_1$-$103_1$ display in this range a decreasing transmission as wavelength increases. By the superposition of the edge filters $84_1$-$88_1,94_1$-$98_1$ with the edge filters $89_1$-$93_1,99_1$-$103_1$ there is achieved a maximum transmission for the desired color hues.

At a certain ratio of layer thickness of the edge filters to the size of the spacing between layer packs in the high resolution pattern, difficulties may arise in the removal of the remaining photoresist layer together with the overlying layers. It is preferred, therefore, to form the filters according to FIG. 5b. The lower edge filter $84_2$-$88_2$ covers the whole surface. The whole-surface edge filter $84_2$-$88_2$ must in certain wavelength ranges have as high and as constant a transmission as possible. This is achieved by a variation of the optical thicknesses of the high-refracting and low-refracting layers $84_2$-$88_2$. Preferably, the optical thicknesses remaining within the range of ±10% from the amount of a quarter wavelength (λ/4), as defined above.

Figure 6A:
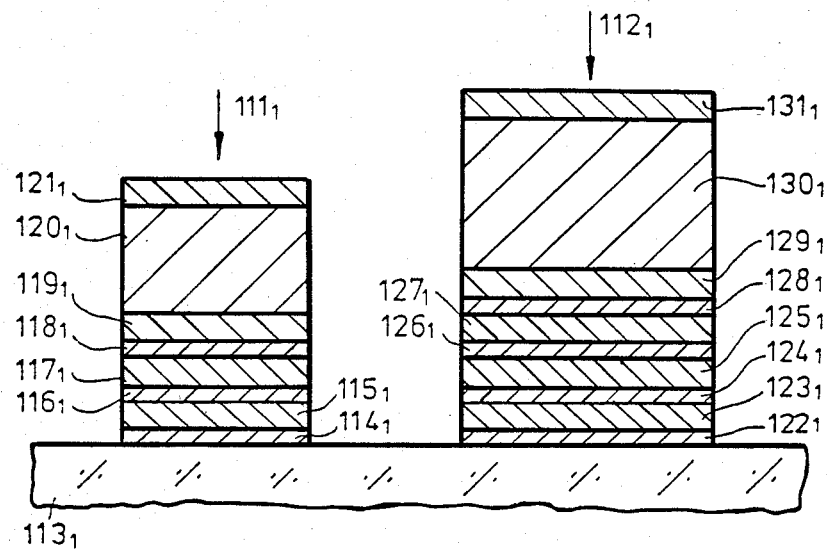
FIGS. 6a and b are schematic diagrams of recording mediums of the present invention having edge filters and metal dielectric filters.

The layer packs may be made as a combination of different filters. Referring now to FIGS. 6a and b, there is shown recording mediums having edge filters and superimposed metal dielectric filters. The layer pack $111_1$ on the substrate $113_1$ in FIG. 6a, consists of an edge filter $114_1$-$118_1$ with high-refracting absorption-free layers $114_1,116_1,118_1$ between which there are present low-refracting absorption-free layers $115_1$ and $117_1$. Layer pack $111_1$ also includes a metal dielectric interference filter $119_1$-$121_1$, with an interference layer $120_1$ which is bounded on both sides by inorganic reflecting layers $119_1,121_1$. The layer pack $112_1$ on the substrate $113_1$ consists of an edge filter $122_1$-$128_1$ with high-refracting absorption-free layers $122_1,124_1$, $126_1,128_1$ between which are low-refracting absorption-free layers $123_1,125_1,127_1$. Also included in layer pack $112_1$ is a metal dielectric interference filter $129_1$-$131_1$ having an interference layer $130_1$ which is bounded on both sides by inorganic reflecting layers $129_1,131_1$. The layers $114_1$-$121_1$ are the pattern-forming layers of the layer pack $111_1$, and the layers $122_1$-$131_1$ are the pattern-forming layers of the layer pack $112_1$.

Figure 6B:
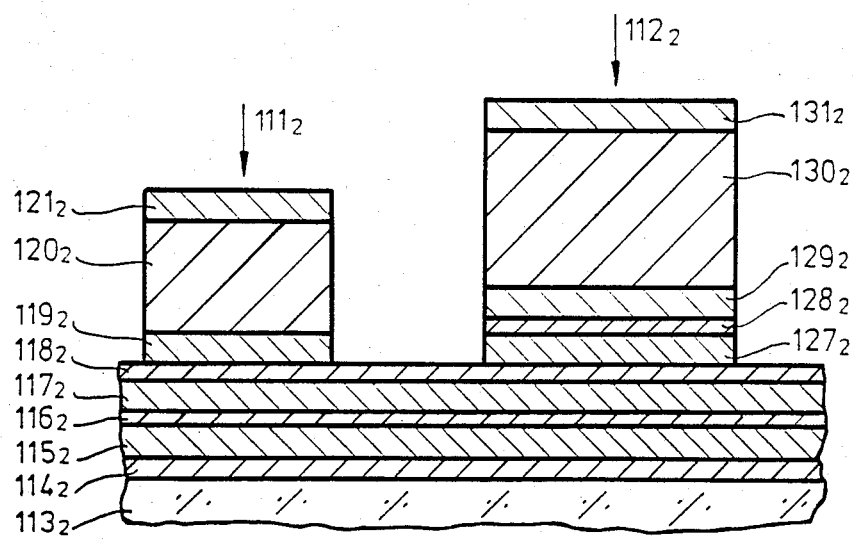

Referring now to FIG. 6b, the layer pack $111_2$ on the substrate $113_2$ consists of an edge filter $114_2$-$118_2$ which covers the whole surface. This edge filter $114_2$-$118_2$ includes whole-surface high-refracting absorption-free layers $114_2,116_2,118_2$ between which there are present whole-surface low-refracting absorption-free layers $115_2,117_2$. The layer pack $111_2$ also includes a metal dielectric interference filter $119_2$-$121_2$ having an interference layer $120_2$ which is bounded on both sides by inorganic reflecting layers $119_2,121_2$. It is the layers of the metal dielectric interference filter $119_2$-$121_2$ which are the pattern-forming layers of the layer pack $111_2$. The layer pack $112_2$ on the substrate $113_2$ consists of the whole surface layers $114_2$-$118_2$, a low-refracting absorption-free layer $127_2$, a high-refracting absorption-free layer $128_2$ and a metal dielectric interference filter $129_2$-$131_2$. The metal dielectric interference filter $129_2$-$131_2$ includes an interference layer $130_2$ which is bounded on both sides by inorganic reflecting layers $129_2,131_2$. The layers $127_2,128_2$ and the metal dielectric interference filter $129_2$-$131_2$ are the pattern-forming layers of the layer pack $112_2$.

The inorganic reflecting layers 4,6,7,9,38, 43,58,67,119,121,129,131 are preferably made of silver, chromium, gold or aluminum or some combination of these materials. The interference layers 5,8,17,24,37,42,57, 59,66,68,120,130 are preferably made of $MgF_2$, $SiO_2$, $Al_2O_3$, $Fe_2O_3$ or some mixture of these materials. The high-refracting layers 14,16,18,20,21,23,25,27,34,36, 39,41,54,56,60,62,63,65,69,71,84,86,88,89,91,93,94,96, 98,99,101,103,114,116,118,122,124,126,128 are preferably made of $TiO_2$, $ZrO_2$, $HfO_2$, $Nd_2O_3$ or some mixture of these materials. The low-refracting layers 15,19,22,26,35, 40,55,61,64,70,85,87,90,92,95,97,100,102,115,117,123, 125,127 are preferably made of $MgF_2$, $SiO_2$, $Al_2O_3$, $Fe_2O_3$ or some mixture of these materials. The substrate 3,13, 33,53,83,113 may be made of a transparent material or of an opaque material with a reflecting surface.

The layer packs 1,2,11,12,31,32,51,52,81,82,111, 112 and the pattern-forming layers making up the layer packs are applied successively by photolithographic means. The pattern-forming layers of the layer packs are applied in a sequence to correspond with the color of the layer pack in the high resolution pattern being formed. According to the process of the present invention, the pattern for a plurality of pattern-forming layers in a layer pack is formed simultaneously when the remainder of a developed layer of photoresist is removed along with the layers overlying it. In addition to the photolithographic process described above, it is possible for the layer packs to be generated by means of wet chemical etching processes or physical etching processes such as ion beam etching, sputter etching, plasma etching or reactive ion etching. It is also possible to generate the layer packs or pattern-forming layers of the layer packs by means of a vapor treatment mask or by means of a controlled particle jet, for example an electron or an ion jet.

Several different embodiments of the present invention may be employed on the same substrate. It is possible that on one part of a substrate, layer packs with partially whole-surface layers can be used while on other parts of the substrate layer packs without any whole-surface layers may be employed. It would also be possible to use different production processes on the same substrate. Different layer packs which are generated adjacent one another define a boundary zone between them which identifies the separation between the layer packs.

The recording mediums of the present invention provide the important advantages of improved color hue purity and color hue saturation. There is also a reduction in the number of rejects created using the present methods described above. These recording mediums are ideally suited for the recording of multicolor microtopographical maps.

Of course, it should be understood that various changes and modifications to the preferred embodiments described above will be apparent to those skilled in the art. For example, application of the layers can be carried out by a number of different methods including vaporization, sputtering, ion plating and precipitation from the vapor phase. It is therefore intended that such changes and modifications be covered by the following claims.

We claim:

1. In a recording medium for a multicolor high resolution pattern, said medium having a substrate which supports at least two pattern-forming layer packs, each comprising a filter such that each layer pack defines a respective color, the improvement comprising:

at least one of said layer packs comprising at least an interference filter having a pattern forming interference layer patterned in the pattern of the interference filter of the respective one of the layer packs, said pattern forming interference layer extending over only a part of the substrate, only in a region defined by the pattern of the interference filter;

at least the pattern forming layers of a first filter included in a first one of the layer packs being applied to the substrate locally separated from and prior in time to the pattern forming layers of a second filter included in a second one of the layer packs.

2. The recording medium of claim 1 wherein at least one of said layer packs comprises at least one purely dielectric interference filter.

3. The recording medium of claim 1 wherein at least one of said layer packs comprises at least one semifilter.

4. The recording medium of claim 1 wherein at least one of said layer packs comprises at least one induced transmission filter.

5. The recording medium of claim 1 wherein at least one of said layer packs comprises at least one metal dielectric interference filter.

6. The recording medium of claim 1 wherein at least one of said layer packs comprises different filters arranged one over the other.

7. The recording medium of claim 1 wherein at least one of said layer packs comprises at least one whole-surface layer applied on said substrate and at least one pattern forming layer.

8. The recording medium of claim 7 wherein said at least one whole-surface layer comprises at least a part of at least one of the filters of the layer packs.

9. The recording medium of claim 1 wherein the pattern forming layers of the first filter comprise a plurality of separate layers physically adjacent to and superimposed over one another, each shaped in a pattern corresponding to that of the first filter.

10. The recording medium of claim 9 wherein the plurality of superimposed layers comprises the pattern forming interference layer.

11. The recording medium of claim 1 wherein the pattern forming layers of the first filter comprise all of the layers of the first filter.

12. The recording medium of claim 1 wherein at least one of the layer packs comprises at least an edge filter.

13. The recording medium of claim 1 wherein said at least one of the layer packs comprising at least an interference filter further comprises an edge filter.

14. In a recording medium for a multicolor high resolution pattern having a substrate which supports at least two pattern-forming layer packs, each comprising a filter, such that each layer pack defines a respective color, the improvement comprising:
at least one of said layer packs comprising at least an edge filter;
at least the pattern forming layers of a first filter included in a first one of the layer packs being applied to the substrate locally separated from and prior in time to the pattern forming layers of a second filter included in a second one of the layer packs.

15. The recording medium of claim 14 wherein said at least one edge filter comprises a plurality of layers, each having an optical thickness which differs from a quarter wavelength ($\lambda/4$), where the wavelength is equal to the greatest wavelength of the least transmission by the edge filter.

16. The recording medium of claim 15 wherein the optical thickness of the layers of the edge filter is within the range of $\pm 10\%$ of said quarter wavelength.

17. The recording medium of claim 14 wherein the pattern forming layers of the first filter comprise a plurality of separate layers physically adjacent to and superimposed over one another, each shaped in a pattern corresponding to that of the first filter.

18. The recording medium of claim 14 wherein the pattern forming layers of the first filter comprise all of the layers of the first filter.

* * * * *